United States Patent [19]
Lee et al.

[11] Patent Number: 5,631,583
[45] Date of Patent: *May 20, 1997

[54] SENSE AMPLIFIER FOR PROGRAMMABLE LOGIC DEVICE HAVING SELECTABLE POWER MODES

[75] Inventors: Napoleon W. Lee, Milpitas; Wei-Yi Ku, San Jose, both of Calif.

[73] Assignee: Xilinx, Inc., San Jose, Calif.

[*] Notice: The term of this patent shall not extend beyond the expiration date of Pat. No. 5,530,384.

[21] Appl. No.: 676,992

[22] Filed: Jul. 8, 1996

Related U.S. Application Data

[63] Continuation of Ser. No. 459,066, Jun. 2, 1995, abandoned.
[51] Int. Cl.$^6$ .................................................... H03F 3/45
[52] U.S. Cl. .................. 327/51; 327/52; 327/54; 365/189.07; 365/205
[58] Field of Search .................... 365/189.07, 205, 365/207; 327/51, 52, 54

[56] References Cited

U.S. PATENT DOCUMENTS

| | | | |
|---|---|---|---|
| 5,402,371 | 3/1995 | Ono | 365/218 |
| 5,530,384 | 6/1996 | Lee et al. | 327/51 |

FOREIGN PATENT DOCUMENTS

| | | | |
|---|---|---|---|
| 404178995 | 6/1992 | Japan | 327/52 |

OTHER PUBLICATIONS

"The Programmable Logic Data Book" copyright 1994, Xilinx, Inc., 2100 Logic Drive, San Jose, CA 95124, pp. 3-5 to 3-8.

*Primary Examiner*—Margaret Rose Wambach
*Attorney, Agent, or Firm*—Patrick T. Bever; Jeanette S. Harms

[57] ABSTRACT

A reconfigurable sense amplifier in accordance with the present invention operates in either a high switching speed mode, where power consumption is a less critical consideration, or in a low power consumption mode, where switching speed is a less critical consideration. In a high speed mode, the present invention provides an additional pull-up to an amplified bitline which in combination with an existing weak pull-up still permits the signal on the amplified bitline to be affected by a change in voltage on the bitline. In a low power mode, the present invention provides a temporary pull-up on the amplified bitline if a signal on a wordline is transitioning from high to low (i.e. indicating that a low-to-high signal transition may occur on the bitline). In this manner, the present invention anticipates that when such a transition occurs, the voltage on the amplified bitline may also increase. Thus, the present invention accelerates the low-to-high signal transition on the amplified bitline in the low power mode. If the signal on the wordline is either a constant high or low, then the additional pull-up is disabled, thereby conserving power during the low power mode. In a further aspect of the invention, a sense amplifier is provided for a cross-point interconnect matrix which avoids coupling noise by isolating the bitline from the access transistors using an EPROM cell.

14 Claims, 3 Drawing Sheets

SENSE AMPLIFIER FOR PROGRAMMABLE LOGIC DEVICE HAVING SELECTABLE POWER MODES

This application is a continuation of application Ser. No. 08/459,066, filed Jun. 2, 1995, now abandoned.

CROSS-REFERENCE TO RELATED APPLICATIONS

"Sense Amplifier Having Selectable Power and Speed Modes", invented by Napoleon W. Lee, et al., U.S. Pat. No. 5,530,384, issued Jun. 25, 1996, is a Continuation-In-Part to the present application and is incorporated herein by reference.

BACKGROUND OF THE INVENTION

1. Technical Field

The invention relates to a sense amplifier, and more particularly to a sense amplifier having selectable power modes.

2. Description of the Related Art

Programmable logic devices (PLDs) are well known in the art. A typical PLD architecture includes an array of function blocks interconnected via an interconnect matrix. Each function block includes an AND array which provides product terms to one of a series of macrocells in the function block. Each macrocell contains an OR gate into which product terms are gated, thereby providing a combinational function. This architecture is described in more detail in the 1994 Xilinx Programmable Logic Data Book on pages 3-5 to 3-8 which is incorporated by reference herein. To provide fast and accurate CMOS level signals to the OR gate, a plurality of sense amplifiers and associated bitlines are used as the AND array which outputs the product terms.

In addition to use in function block AND arrays, sense amplifiers are also used in the interconnect matrices of PLDs. In particular, XC7000 series EPLDs employ a cross-point interconnect circuit to interconnect the function blocks. The cross-point interconnect matrix includes wordlines, which are connected to PLD inputs and feedback lines from the macrocells, and bitlines. Sense amplifiers are coupled to the bitlines for generating function block input signals. Similar to the AND array of a function block, wordline signals can be "ANDed" together within the cross-point interconnect matrix before being transmitted to a function block. FIG. 1 shows such a known sense amplifier 100 having two enable lines ENA and $\overline{ENA}$. Sense amplifier 100 is turned on or enabled by applying a logic 0 signal to line $\overline{ENA}$, thereby turning off N-channel transistor 101, and a logic 1 signal to line ENA. Thus, the voltage level on a feedback line FB is established by a weak pull-up N-channel transistor 103 which is turned on by the logic 1 signal provided on line ENA and a strong pull-down N-channel transistor 104 which is controlled by the signal on bitline BL. The voltage provided to a feedback line FB controls the state of N-channel transistor 102, which operates in its linear range.

A weak P-channel transistor 105 and a strong N-channel transistor 102 provides a low trigger point at a bitline voltage on the order of 0.75 volts. If the voltage on bitline BL is high, transistor 104 turns more on, thereby pulling the voltage on feedback line FB lower. This lower voltage in turn causes transistor 102 to turn more off, thereby pulling up the voltage on bitline BL less and assisting the next movement on bitline BL (i.e. the voltage going low).

Conversely, if the voltage on bitline BL is low, the voltage on feedback line FB is higher. This higher voltage in turn causes transistor 102 to turn more on, thereby pulling bitline BL to a higher voltage (via transistor 105 which serves as a current source, and operates in saturation mode).

Thus, the voltage on line ABL is controlled by transistor 102 in conjunction with bitline BL. In response to the signal on bitline BL, two ratioed inverters 106 and 107 ensure that the output voltage provided on output line PT is at CMOS levels. Table 1 shows one example of logic 0 and logic 1 voltage values on the lines BL, FB, ABL, and PT.

TABLE 1

| Signal | Logic 1 | Logic 0 | Difference |
|---|---|---|---|
| BL | 0.769 v | 0.746 v | 0.023 v |
| FB | 1.77–1.88 v | N/A | N/A |
| ABL | 2.76 v | 2.18 v | 0.58 v |
| NBL | 0.491 v | 3.33 v | 2.84 v |
| PT | 4.4 v | 0 v | 4.4 v |

Table 1 shows that a small swing in the voltage on bitline BL can produce a switch in the CMOS signal on output line PT.

Depending upon the states of EPROMs 121-1 through 121-n as controlled by word lines WL1 through WLn, the voltage on bitline BL is pulled lower or higher to indicate a logic 0 or logic 1 signal. If any of word lines WL1 through WLn is a logic 1 and assuming that EPROMS are erased, then the voltage on bitline BL is pulled lower to indicate a logic 0 signal. When biased on, EPROMs 121-1 through 121-n pull the voltage on bitline BL toward virtual ground VG. As shown in FIG. 1, virtual ground VG is separated from actual ground by transistor 111, which is controlled by a signal on line ABL.

Unfortunately, sense amplifier 100 draws substantial amounts of DC current in both the bitline high and bitline low states, e.g. on the order of a few hundred microamps, in addition to the large AC switching current generated during a transition in bitline state. In fact, sense amplifiers are responsible for drawing the majority of the DC current in a PLD. Therefore, a need arises for a sense amplifier that can be selectively configured for high speed signal propagation along critical signal paths, and otherwise for low power consumption along less critical signal paths.

SUMMARY OF THE INVENTION

A reconfigurable sense amplifier in accordance with the present invention operates in either a high switching speed mode, where power consumption is a less critical consideration, or in a low power consumption mode, where switching speed is a less critical consideration.

In the disclosed embodiments of the invention, the memory cells associated with the sense amplifier are flash EPROMs. The control gates of a row of memory cells are coupled to a high voltage source Vcc, thereby turning on any erased memory cells.

In a first disclosed embodiment of the invention, one terminal of each memory cell is coupled to the source of an associated access transistor, whereas the other terminal is coupled to a virtual ground. The drain of each access transistor is coupled to a bitline, whereas the gate is coupled to a wordline.

In a second disclosed embodiment of the invention, one terminal of each memory cell is coupled to a bitline, whereas the other terminal is coupled to the drain of an associated access transistor. The source of each access transistor is coupled to a virtual ground, and the gate is coupled to a wordline.

In the first and second disclosed embodiments, the voltage on the bitline is high only under two conditions. First, the voltage on the bitline is high if the signals on the wordlines are low, thereby turning off the access transistors and preventing any pull-down provided by a conducting memory cell. Second, notwithstanding high signals on the wordlines, all memory cells are programmed, thereby also preventing any pull-down. In other words, assuming high signals are provided on the wordlines, if any memory cell is erased, the voltage on the bitline is pulled low. Therefore, assuming erased memory cells, it logically follows that (1) the voltage on the bitline is low if the signal on one or more of the wordlines is high and (2) a low-to-high signal transition on the bitline can only occur in response to a high-to-low signal transition on all wordlines.

In a high speed mode, the present invention provides an additional pull-up to an amplified bitline which in combination with an existing weak pull-up still permits the signal on the amplified bitline to be affected by a change in voltage on the bitline. In a low power mode, the present invention provides a temporary pull-up on the amplified bitline if a signal on a wordline is transitioning from high to low (i.e. indicating that a low-to-high signal transition may occur on the bitline). In this manner, the present invention anticipates that when such a transition occurs, the voltage on the amplified bitline may also increase. Thus, the present invention accelerates the low-to-high signal transition on the amplified bitline in the low power mode. If the signal on the wordline is either a constant high or low, then the additional pull-up is disabled, thereby conserving power during the low power mode.

DETAILED DESCRIPTION OF THE DRAWINGS

Figure 1:
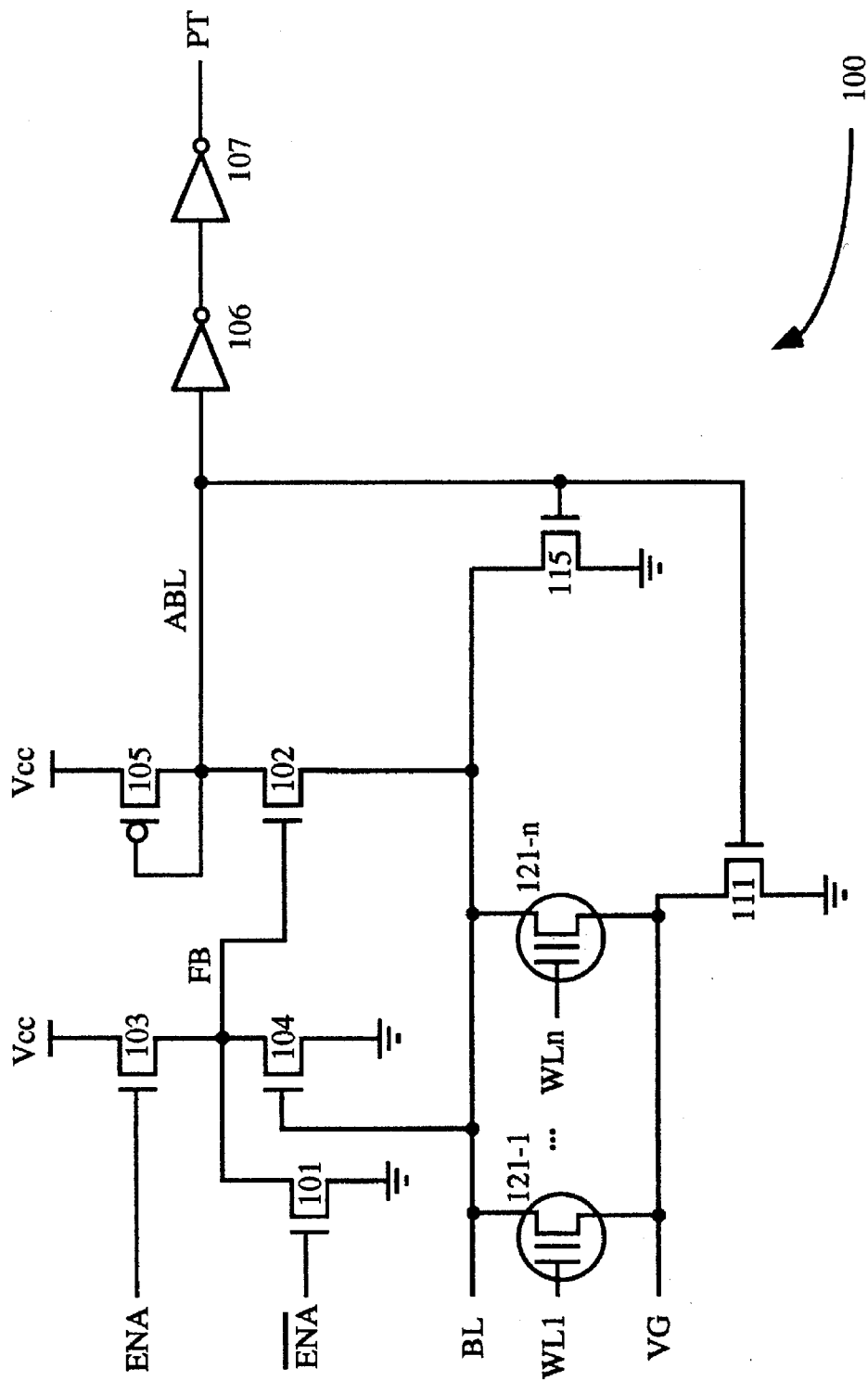
FIG. 1 is a block schematic diagram of a prior art sense amplifier.
Figure 2:
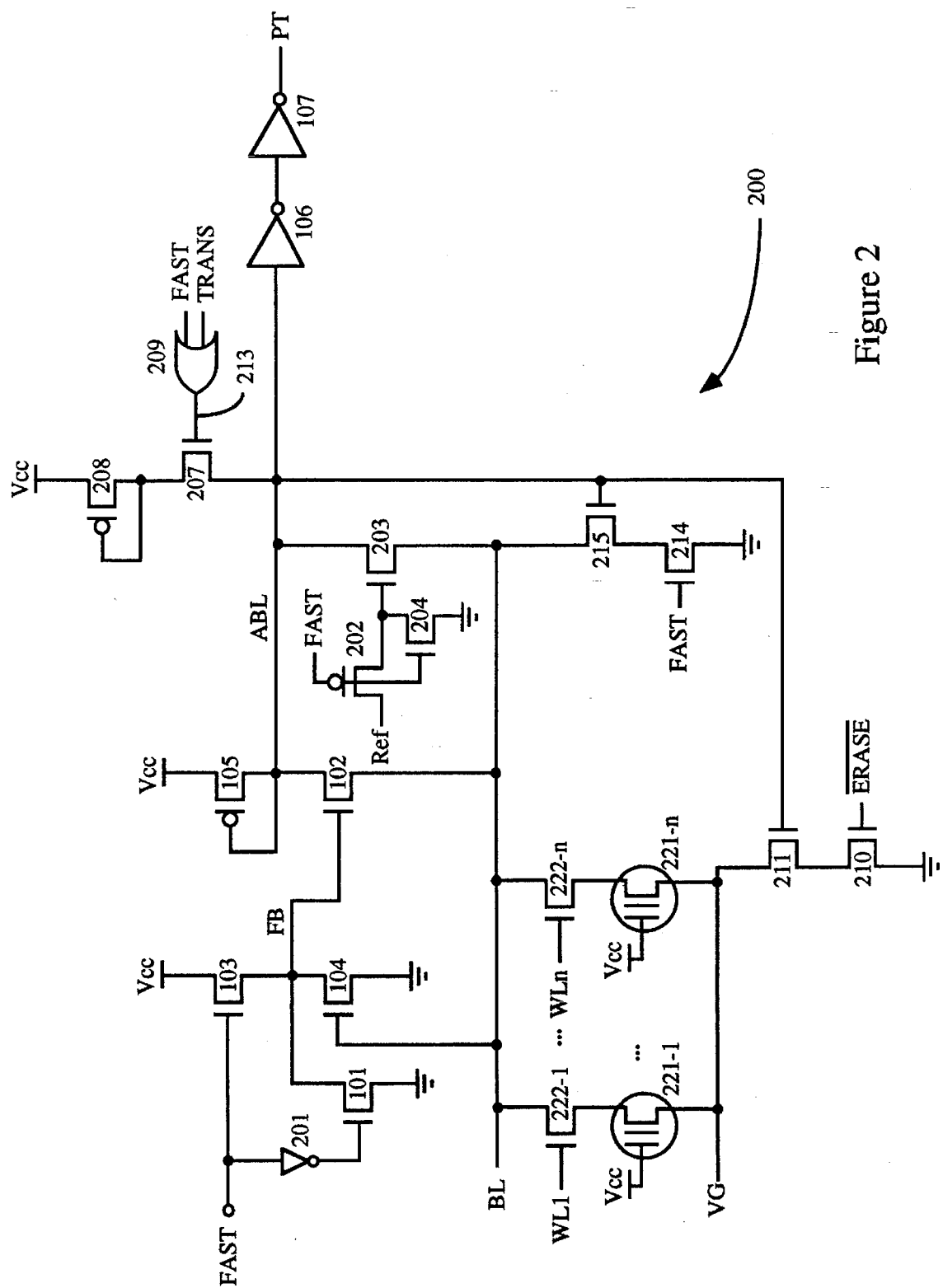
FIG. 2 is a schematic diagram of a first sense amplifier having selectable power modes according to the present invention.

FIG. 2 illustrates a reconfigurable sense amplifier 200-1 in accordance with a first disclosed embodiment of the present invention that operates in either a high switching speed mode, where power consumption is a less critical consideration, or in a low power consumption mode, where switching speed is a less critical consideration.

In this embodiment, the memory cells associated with the sense amplifier are flash EPROMs which include associated access transistors. The control gates of a row of memory cells 221-1 to 221-n are coupled to a high voltage source Vcc, thereby turning on any erased memory cells. One terminal of each memory cell 221 is coupled to the source S of an associated access transistor 222 (one of access transistors 222-1 to 222-n), whereas the other terminal is coupled to a virtual ground line VG. The drain D of each access transistor 222 is coupled to a bitline BL, whereas the gate G is coupled to a wordline WL (one of wordlines WL1-WLn).

Thus, the voltage on bitline BL is high only under two conditions. First, the voltage on bitline BL is high if the signals on wordlines WL1-WLn are low, thereby turning off access transistors 222-1 through 222-n, respectively, and preventing any pull-down provided by any erased memory cell 221. Second, notwithstanding high signals on wordlines WL1-WLn, all memory cells 221-1 through 221-n are programmed, thereby also preventing any pull-down. In contrast, if any memory cell 221 is erased (and the signals on the associated wordline WL is high), the voltage on bitline BL is pulled low. Therefore, assuming erased memory cells 221, it logically follows that the voltage on bitline BL is low only if the signal on one or more wordlines WL is high, and a low-to-high signal transition on bitline BL only occurs in response to a high-to-low signal transition on all wordlines WL. As described in detail below, sense amplifier 200-1 anticipates these high-to-low signal transitions on wordlines WL in the low power mode so that sense amplifier mode switching occurs in time to assist the concomitant low-to-high signal transitions on bitline BL.

In accordance with the present invention, if a fast switching speed mode is desired, an enabling (i.e. high) FAST signal is routed to sense amplifier 200-1. In one embodiment, the FAST signal is a latched signal that is set by a configuration bit in the PLD programming logic. In other embodiments, the FAST signal is an intermediate product term of a logic function, or a user interrupt signal (for example, in a power control circuit for a laptop computer). The FAST signal is routed to several devices in sense amplifier 200-1.

For example, an enabling FAST signal turns off transistor 101 (via inverter 201), and turns on transistor 103. Conducting transistor 103 transfers a high signal to the gate of transistor 102, thereby turning on that transistor. An enabling FAST signal also turns off transistor 202, and turns on transistor 204. Conducting transistor 204 transfers a low signal to the gate of transistor 203, thereby turning off that transistor. Therefore, in the high power mode, the present invention disables the branch between bitline BL and amplified bitline ABL which includes transistor 203. In one embodiment, transistor 102 is a wider device than transistor 203, and therefore is capable of sourcing more current. Width to length ratios for pertinent transistors are listed in parentheticals hereafter: transistor 102 (20), transistor 203 (6), transistor 105 (1.2), transistor 211 (13), transistor 215 (0.4), transistor 214 (4), transistor 207 (4), and transistor 208 (2).

Additionally, an enabling FAST signal provided to OR gate 209 ensures that OR gate 209 provides a high signal on output line 213. That high signal turns on transistor 207, thereby allowing transistor 208 to provide a moderate pull-up on line ABL. Note that transistor 105 also provides a weak pull-up on line ABL. However, because neither transistor 105 nor transistor 208 are strong devices, the present invention still permits the signal on amplified bitline ABL to be affected by a small change in voltage on bitline BL.

Note that the FAST signal is also routed to an N-channel transistor 214 which turns on that transistor. If a high signal is provided on amplified bitline ABL, transistor 215 is turned on, thereby pulling down the voltage on bitline BL in anticipation of a high-to-low signal transition on the bitline. In this manner, the present invention speeds up any signal transition on amplified bitline ABL in the high speed mode. However, note that in the high speed mode for a bitline high condition a current path is created through transistors 105, 102, 215, and 214, thereby increasing power consumption in sense amplifier 200-1. Moreover, because the signal on line ABL is analog, both inverters 106 and 107 also burn power. In a bitline low condition, transistors 222, 211, and 210 as well as erased memory cell 221 provide yet another current path.

In contrast, a disabling (i.e. low) FAST signal turns off transistor 103, and turns on transistor 101, thereby pulling down the voltage on line FB and turning off transistor 102. The disabling FAST signal also turns off transistor 204, and turns on transistor 202. Conducting transistor 202 transfers a reference signal REF (typically 2.0–2.5 volts) to the gate of transistor 203, thereby turning on that transistor. Therefore, in the low power mode, the present invention disables the branch between bitline BL and amplified bitline ABL which contains transistor 102. Moreover, a low FAST signal turns off transistor 214. Thus, in the low power mode, the leaker path including transistors 214 and 215 is eliminated, thereby saving additional power. Specifically, in the low speed mode, the signal on line ABL nears digital levels (for example assuming a bitline high condition, voltage source Vcc minus the threshold voltage of transistor 105), thereby ensuring inverters 106 and 107 burn almost zero power. As noted previously, in a bitline low condition, transistors 222, 211, and 210 as well as erased memory cell 221 provide a current path.

In accordance with the present invention in the low power mode, the state of bitline BL is anticipated by OR gate 209. Specifically, the disabling FAST signal provided to OR gate 209 ensures that OR gate 209 provides a high signal to inverter 106 (via transistors 207 and 208) only as the voltages on wordlines WL transition from a logic one to a logic zero. That transition (i.e. a momentary transition of signal TRANS to a logic one) is detected by a circuit (not shown) which is described in detail in patent application Ser. No. 08/311,094 entitled, "Low-Power Memory Device with Accelerated Sense Amplifiers", incorporated herein by reference in its entirety.

Therefore, in the low power mode, the present invention provides a temporary pull-up (via conducting transistor 208 and temporary, conducting transistor 207) on amplified bitline ABL if a signal on wordline WL is transitioning from high to low. To minimize use of RMS and AC current, one embodiment of the present invention supplies approximately 100 uA current for a duration of 3 ns. Other embodiments supply current bursts of different sizes and duration as required by the PLD based upon speed and power consumption or other such considerations. Thus, the present invention anticipates that when such a transition occurs, the voltage on amplified bitline ABL may also increase. In this manner, the present invention accelerates the low-to-high signal transition on amplified bitline ABL in the low power mode. Therefore, sense amplifier 200-1 provides the best speed despite being in the low DC power mode configuration.

If the signal on the wordline is either a constant high or low, then the additional pull-up provided by transistors 208 and 207 is disabled, thereby conserving power during the low power mode. In one embodiment of the invention, sense amplifier 200-1 switches at 2 nanoseconds or better in the high speed mode, and at about 6 to 7 nanoseconds when in the low power mode.

N-channel devices 210 and 211 provide a current sink from virtual ground VG to ground during use of sense amplifier 200-1. When the flash EPROM cells 221 are being erased, transistor 210 is turned off to disable the pull-down path on virtual ground line VG. Other embodiments of the present invention using other than flash EPROM cells delete device 210.

Figure 3:
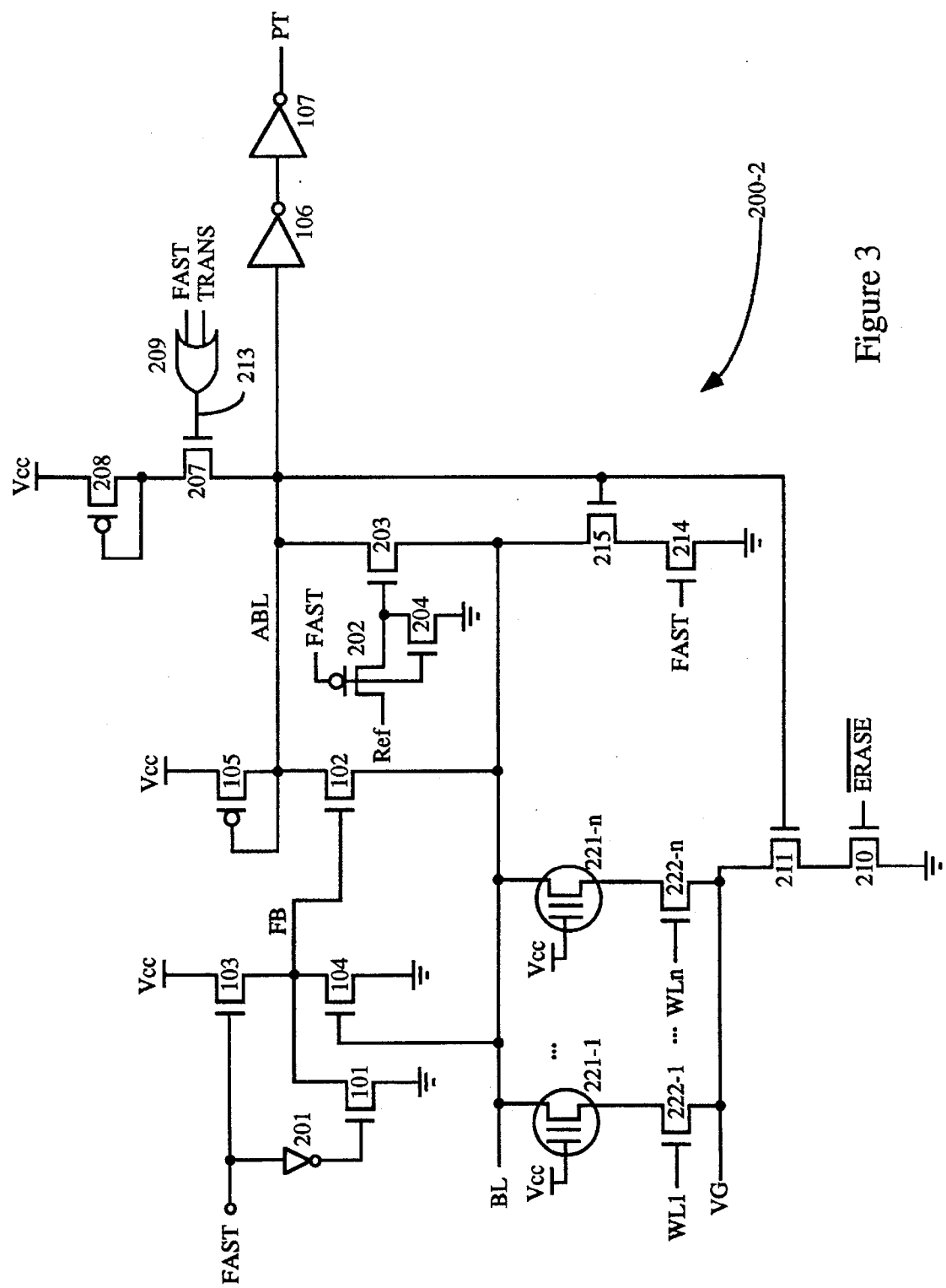
FIG. 3 is a schematic diagram of a second sense amplifier having selectable power modes according to the present invention.

FIG. 3 shows sense amplifier 200-2 according to a second embodiment of the invention. Sense amplifier 200-2 is preferably used in cross-point interconnect matrices, as described in co-owned U.S. application Ser. No. 08/430,207, filed Apr. 26, 1995, entitled "CROSS-POINT INTERCONNECT STRUCTURE WITH REDUCED AREA", which is incorporated herein in its entirety.

Sense amplifier 200-2 is substantially identical to the sense amplifier 200-1 of FIG. 2 (discussed above), with the only exception being the arrangement of flash EPROM cells 221 and access transistors 222. In particular, whereas sense amplifier 200-1 includes access transistors 222 coupled between bitline BL and their associated flash EPROM cells 221, sense amplifier 200-2 includes flash EPROM cells 221 coupled between bitline BL and their associated access transistors 222. Sense amplifier 200-2 is particularly useful in cross-point interconnect matrices for reducing coupling noise. Coupling noise is produced on the bitlines of a cross-point interconnect matrix when multiple wordlines are switched concurrently in a common direction. This coupling noise is avoided in function block AND arrays because the wordlines of the AND arrays are typically complemented, thereby creating a counteractive (cancelling) effect. However, cross-point interconnect matrices differ from typical function block AND arrays in that wordline signals of a cross-point interconnect matrix are transmitted on single lines (i.e., the wordlines are not complemented). Therefore, multiple concurrent wordline switching in a cross-point interconnect matrix, particularly when the wordlines switch in a common direction, causes coupling noise on the bitlines.

Sense amplifier 200-2 reduces the coupling effect caused by multiple wordline switching in a cross-point interconnect matrix by connecting flash EPROM cells 221 between access transistors 222 and bitline BL, thereby isolating bitline BL from wordlines WL1 through WLn. Referring briefly to FIG. 2, coupling noise can occurs because the most dominant coupling between wordlines WL1 through WLn and bitline BL in sense amplifier 200-2 is from the gate to the drain, the drain being connected directly to bitline BL. Sense amplifier 200-2 eliminates this coupling component by isolating bitline BL from the drain of access transistors 222 using EPROM cells 221 (see FIG. 3).

Further explanation regarding coupling noise caused by multiple wordline switching is described in co-owned U.S. application Ser. No. 08/459,236, filed Jun. 2, 1995, entitled "METHOD AND APPARATUS FOR REDUCING COUPLING SWITCHING NOISE IN INTERCONNECT ARRAY MATRIX", which is incorporated herein in its entirety.

Although the invention is described herein with reference to the embodiments shown in FIGS. 2 and 3, one skilled in the art will readily appreciate that other devices/circuits may be substituted for those set forth herein without departing from the spirit and scope of the present invention. In alternate embodiments of the invention, the logic may be inverted or mixed to allow the use of devices which respond to differing logic levels. For example, sense amplifiers 200-1 and 200-2 can be adapted to operate with either or both of NMOS and PMOS devices. In other embodiments, the invention may be used with memory arrays having multiple bitlines. The invention can also be applied to EPLD AND arrays and similar devices having an array of memory elements that are connected between bitlines and a ground or virtual ground, for example, devices including multiplexers that interconnect multiple functional blocks. Additionally, OR gate 209 is eliminated in those applications requiring a FAST mode. Accordingly, the invention should only be limited by the claims included below.

We claim:

1. A sense amplifier for a programmable logic device comprising:

a plurality of memory cells coupled to a bitline;

an amplified bitline for mirroring signal transitions on said bitline;

a selectable current source coupled to said amplified bitline which is activated during a high speed mode and during a low power mode if a low-to-high signal transition occurs on said bitline.

2. The sense amplifier of claim 1 further comprising a first branch selectively coupling said bitline and said amplified bitline, and a second branch selectively coupling said bitline and said amplified bitline, wherein said first branch is selected during said high speed mode and said second branch is selected during said low power mode.

3. The sense amplifier of claim 2 further comprising a selectable current sink in response to the signal on said amplified bitline in said high speed mode.

4. The sense amplifier of claim 3 wherein said selectable current source includes a logic gate which provides an output signal to the gate of a first transistor, wherein said first transistor is coupled between a voltage source and said amplified bitline.

5. The sense amplifier of claim 4 wherein said logic gate receives a high speed activating/deactivating signal.

6. The sense amplifier of claim 5 wherein said plurality of memory cells are flash EPROM cells, wherein the control gates of said flash EPROM cells are coupled to said voltage source and the access gates of said flash EPROM cells are coupled to a plurality of wordlines.

7. The sense amplifier of claim 6 wherein said logic gate receives a temporary high signal during a high-to-low signal transition on one of said wordlines.

8. The sense amplifier of claim 7 wherein said logic gate is an OR gate.

9. The sense amplifier of claim 3 wherein said second branch includes a first transistor, wherein one terminal of said first transistor is coupled to said bitline and another terminal of said first transistor is coupled to said amplified bitline, wherein said second branch further includes a circuit for providing either a low control signal to said first transistor in said fast speed mode or a reference control signal to said transistor in said low power mode.

10. The sense amplifier of claim 9 wherein said selectable current sink includes a second transistor and a third transistor, wherein one terminal of said second transistor is coupled to said bitline and another terminal of said second transistor is coupled to one terminal of said third transistor, wherein another terminal of said third transistor is coupled to a voltage source, wherein the control terminal of said second transistor receives the signal on said amplified bitline and the control terminal of said third transistor receives a high speed activating/deactivating signal.

11. A method of operating a sense amplifier for a programmable logic device comprising the steps of:

providing at least one supplementary current path within said sense amplifier to augment a default sense amplifier current source/sink; and selecting said at least one supplementary current path in response to a switching speed select signal and a wordline logic level transition.

12. The sense amplifier of claim 1, wherein said plurality of memory cells are flash EPROM cells, each EPROM cell having a first terminal connected to the bitline, a control gate coupled to a first voltage source, and a second terminal; and wherein the sense amplifier further comprises a plurality of access transistors, each access transistor having a first terminal coupled to the second terminal of one of said flash EPROM cells, a control gate coupled to a wordline, and a second terminal coupled to a second voltage source.

13. The sense amplifier of claim 1, further comprising:

a plurality of access transistors, each access transistor having a first terminal coupled to the bitline, a control gate coupled to a wordline, and a second terminal;

wherein said plurality of memory cells are flash EPROM cells, each EPROM cell having a first terminal connected to the second terminal of one of the access transistors, a control gate coupled to a first voltage source, and a second terminal coupled to a second voltage source.

14. A sense amplifier for an interconnect matrix of a programmable logic device, the interconnect matrix including a plurality of wordlines and a plurality of bitlines, the sense amplifier comprising:

a plurality of EPROM cells coupled to one of the plurality of bitlines, each of the plurality of EPROM cells having a control gate connected to a first voltage source; and a plurality of access transistors, each of the plurality of access transistors being coupled between an associated one of the plurality of flash EPROM cells and a second voltage source;

wherein each of the plurality of access transistors includes a control gate coupled to one of the plurality of wordlines.

* * * * *